United States Patent [19]
Kato

[11] Patent Number: 5,379,064
[45] Date of Patent: Jan. 3, 1995

[54] CCD IMAGER HAVING FOUR-PHASE VERTICAL SHIFT REGISTERS OPERATED BY THREE-VALUED CLOCK SIGNALS

[75] Inventor: Naoki Kato, Kanagawa, Japan

[73] Assignee: Sony Corporation, Tokyo, Japan

[21] Appl. No.: 196,794

[22] Filed: Feb. 15, 1994

Related U.S. Application Data

[63] Continuation of Ser. No. 902,665, Jun. 22, 1992, abandoned.

[30] Foreign Application Priority Data

Jun. 21, 1991 [JP] Japan .................. 3-150517

[51] Int. Cl.$^6$ .................................... H04N 5/335
[52] U.S. Cl. .............................. 348/248; 257/221
[58] Field of Search ............... 348/311, 302, 303, 241, 348/243, 248; 257/236, 246, 219, 221, 239, 222; H04N 5/335

[56] References Cited

U.S. PATENT DOCUMENTS

| | | | |
|---|---|---|---|
| 4,592,130 | 6/1986 | Nash | 257/219 |
| 4,654,682 | 3/1987 | Boudewijns | 257/219 |
| 4,656,518 | 4/1987 | Kosonocky et al. | 358/213 |
| 4,689,687 | 8/1987 | Koike et al. | 358/213.24 |
| 4,698,657 | 10/1987 | Kamata | 257/221 |
| 4,910,569 | 3/1990 | Erhardt | 257/246 |

FOREIGN PATENT DOCUMENTS

60-004379  5/1985  Japan .
63-122266  10/1988  Japan .
2-264439  10/1990  Japan .

Primary Examiner—Joseph Mancuso
Assistant Examiner—Tuan V. Ho
Attorney, Agent, or Firm—Hill, Steadman & Simpson

[57] ABSTRACT

A CCD imager includes at least one four-phase vertical shift register having first, second, third and fourth transfer electrodes. In order to prevent nonuniform distribution of smear charge and other unwanted charge, and improve the quality of a picture, there is further provided a means for making the potential well under each first electrode deeper than the potential wells under the second, third and fourth electrodes. Preferably, a N-type semiconductor region is formed under each first electrode by ion implantation.

7 Claims, 11 Drawing Sheets

CCD IMAGER HAVING FOUR-PHASE VERTICAL SHIFT REGISTERS OPERATED BY THREE-VALUED CLOCK SIGNALS

This is a continuation, of application Ser. No. 07/902,665, filed Jun. 22, 1992 now abandoned.

BACKGROUND OF THE INVENTION

The present invention relates to a CCD imager having 4-phase vertical shift registers operated by three-valued clock signals (having readout level, high level and low level).

Figure 5A:
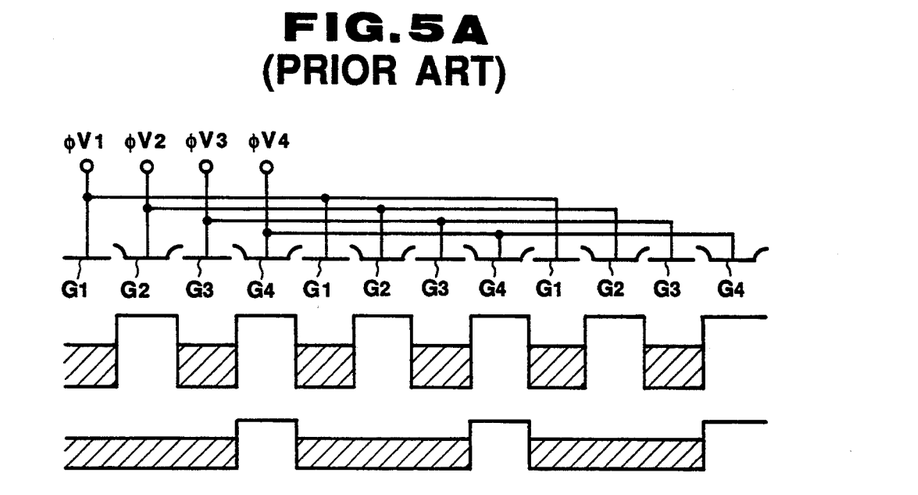
FIGS. 5A and 5B are schematic sectional view and schematic plan view of a vertical shift register in the odd field of a field readout mode.
Figure 5B:
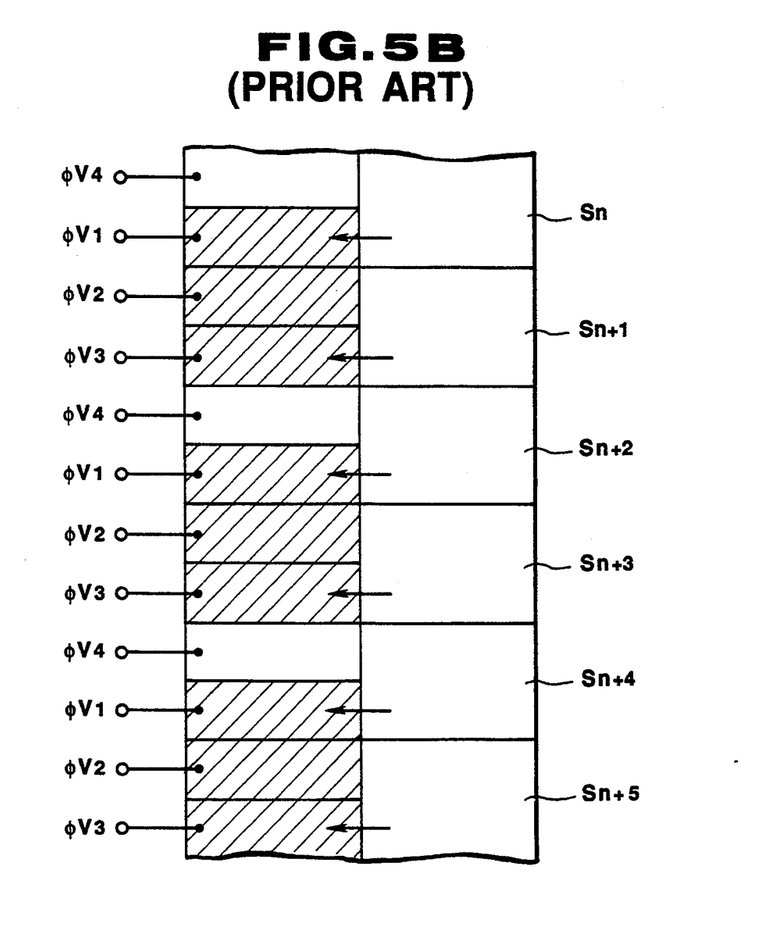

In general, a four-phase CCD solid-state imager has at least one photosensitive imaging section, and one or more shift registers having four clock input terminals connected with a driver circuit 21 (shown in FIG. 8) by four clock lines. Field readout operations of such a CCD solid-state imager is performed as shown in FIGS. 5A–6B. During a readout period, readout pulses (of 15 V) are applied, respectively, to first transfer electrodes G1 for receiving a first drive pulse signal $\phi$V1, and third transfer electrodes G3 for receiving a third drive pulse signal $\phi$V3. In the odd field, as shown in FIGS. 5A and 5B, signal charge packets are transferred from photosensitive elements Sn, Sn+1, Sn+2, Sn+3, ... to corresponding potential wells which are formed independently under the first and third transfer electrodes G1 and G3. Thereafter, the potential barrier under each second transfer electrode G2 is lowered to create a wide potential well extending continuously under the first, second and third electrodes G1, G2 and G3 of each stage. Thus, one continuous potential well is formed for each of pairs (Sn, Sn+1), (Sn+2, Sn+3), . . . . Therefore, the signal charge of the nth photosensitive element Sn of the nth row is mixed with the signal charge of the (n+1)st photosensitive element Sn+1 of the (n+1)st row in the corresponding continuous wide potential well. The next continuous potential well serves for mixing the signal charge packets of the next pair (Sn+2, Sn+3). In this way, the signal charge of each photosensitive element is mixed with the signal charge of the mate of the pair. In these figures, signal charge is shown by parallel oblique lines.

Figure 6A:
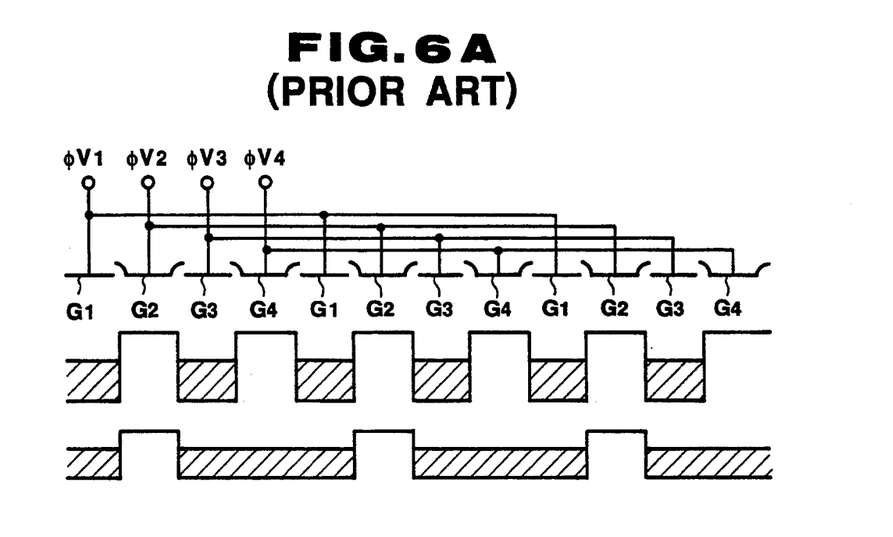
FIGS. 6A and 6B are schematic sectional view and schematic plan view of a vertical shift register in the even field of the field readout mode.
Figure 6B:
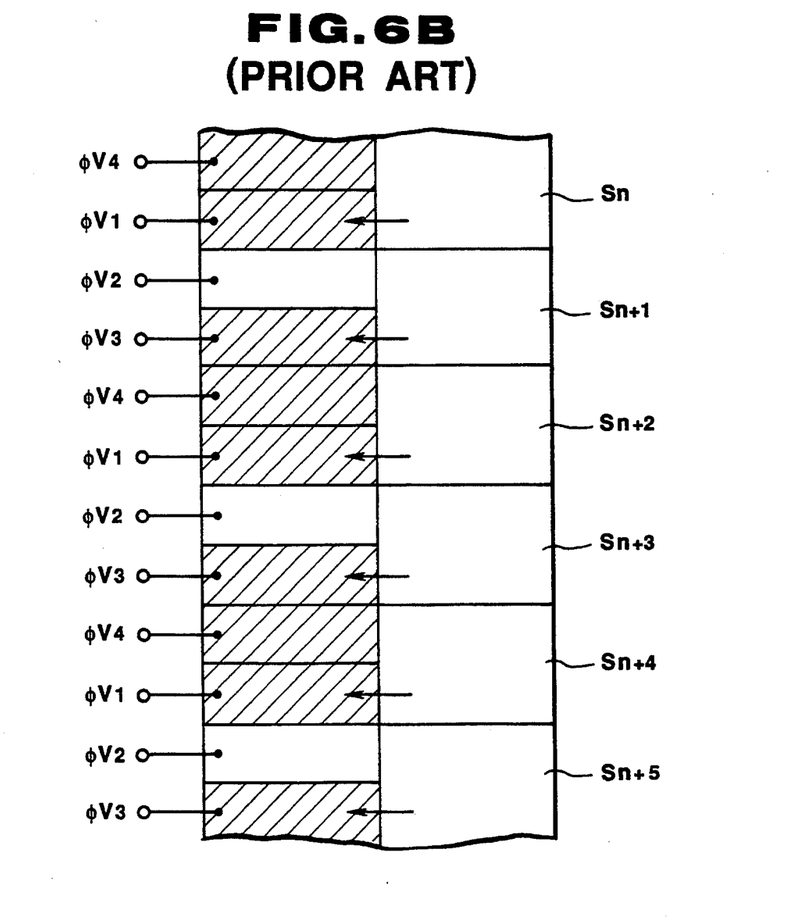

In the even field, the photosensitive elements are paired to form pairs (Sn+1, Sn+2), (Sn+3, Sn+4), . . . . First, signal charge packets of the photosensitive elements are transferred to respective independent potential wells formed under the first and third transfer electrodes G1 and G3. Then, lowering the potential barrier of each fourth transfer electrode G4 creates a continuous wide potential well extending continuously under the third, fourth and first electrodes G3, G4 and G1. Therefore, the continuous wide potential wells function to mix the signal charge packets of the (n+1)st row and (n+2)nd row, the signal charge packets of the (n+3)rd row and (n+4)th row, and so on.

Figure 7:
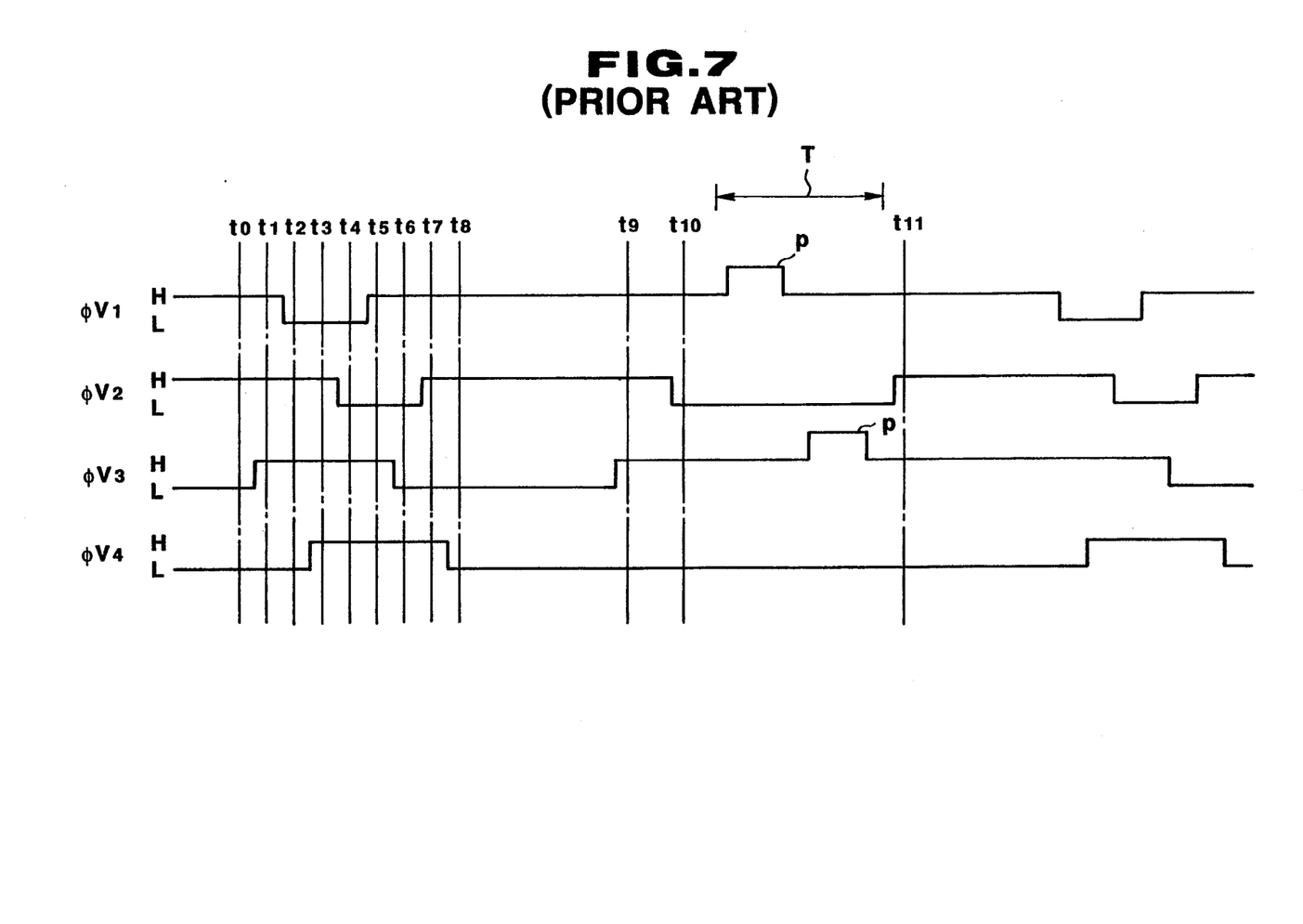
FIG. 7 is a time chart showing sequentially clocked vertical drive pulses $\phi$V1, $\phi$V2, $\phi$V3 and $\phi$V4 in the odd field in a conventional example.
Figure 8:
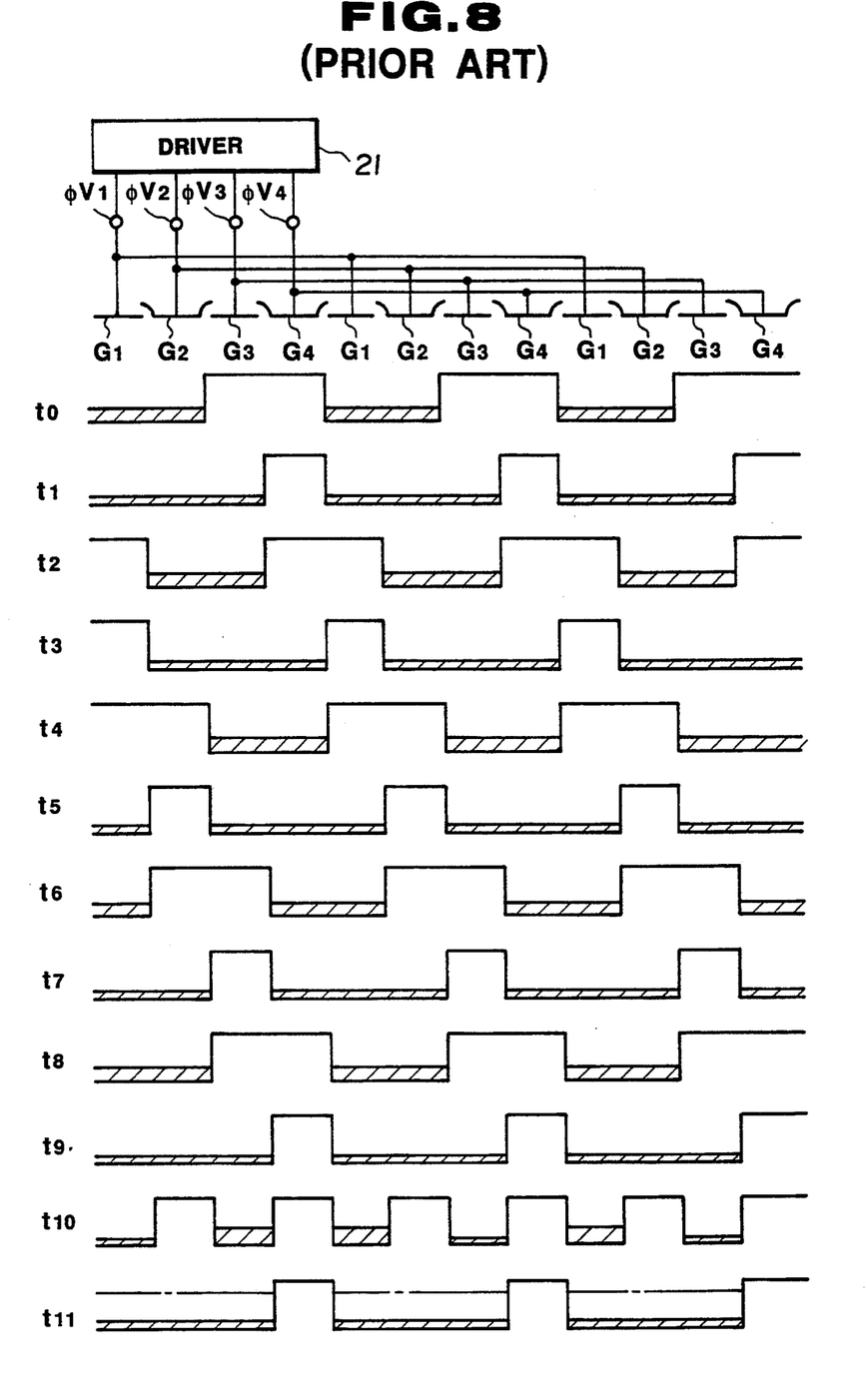
FIG. 8 is a schematic view showing operations of a conventional vertical shift register in the odd field.
Figure 9:
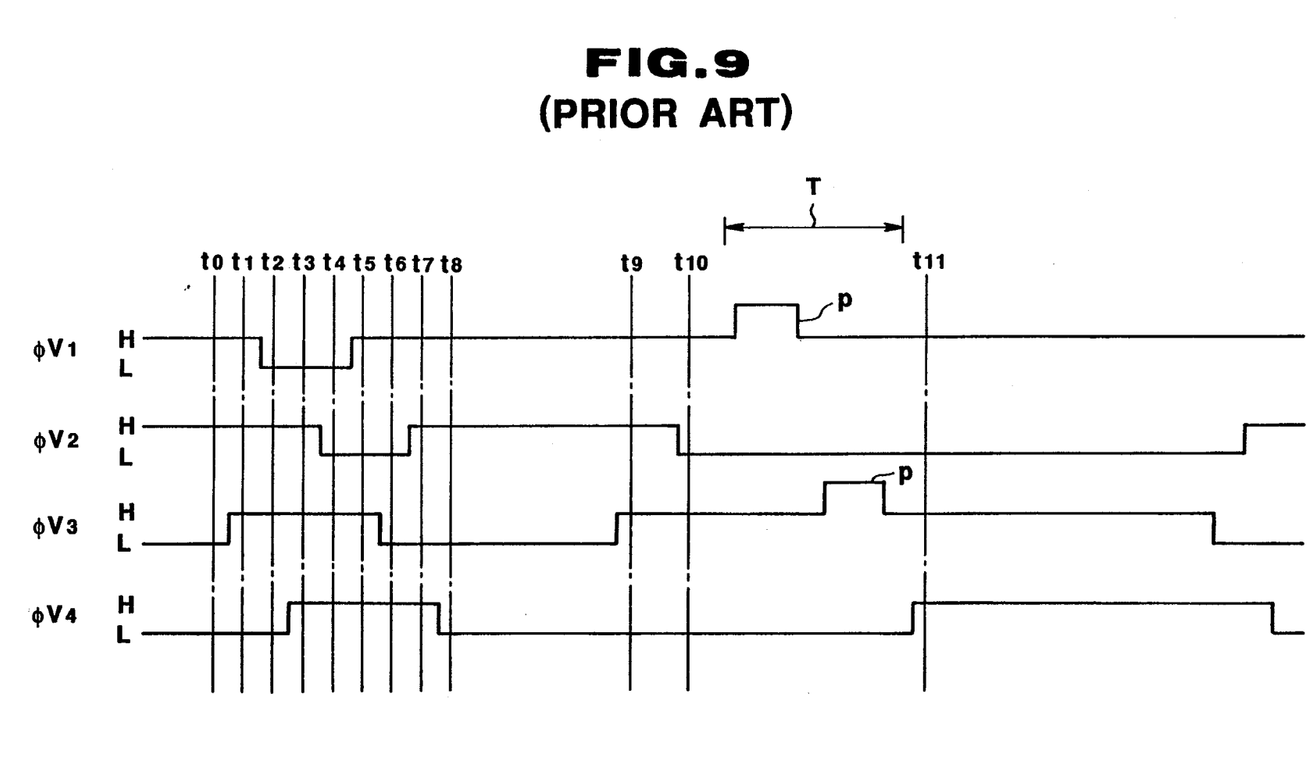
FIG. 9 is a time chart showing the vertical drive pulses in the even field.
Figure 10:
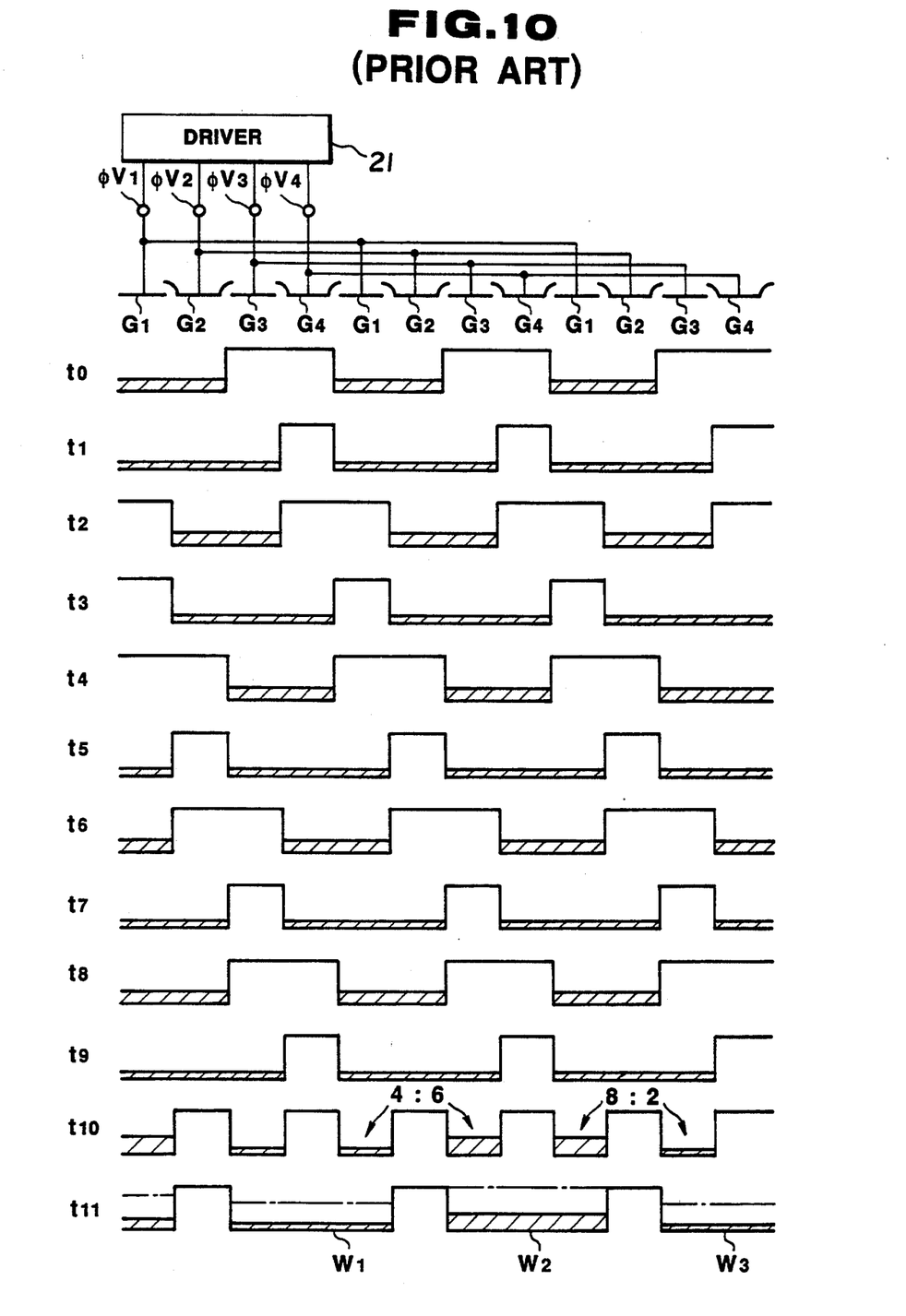
FIG. 10 is a schematic view showing operation of the conventional vertical shift register in the even field.

Unwanted charge, such as smear charge and dark signal charge, generated in the vertical shift registers are also transferred in the same manner as explained above for the signal charge. FIGS. 7 and 8 show the clock pulse waveforms for the vertical registers and profiles of potential in the odd field. FIGS. 9 and 10 shows the clock pulse waveforms and potential profiles in the even field. In these figures, unwanted charge including smear charge and dark signal charge is shown by parallel oblique lines.

In the odd field, the unwanted charge packet stored under the first and second transfer electrodes G1 and G2 of a given electrode set (the first electrode set, for example) at an instant t0 is shifted to the right as viewed in FIG. 8, and this unwanted charge packet exists in the location under the first and second electrodes G1 and G2 of the next electrode set (the second set, for example) at an instant t8, as shown in FIG. 8. At this instant t8 (t=t8), the first and second drive pulse signals $\phi$V1 and $\phi$V2 are held at the high level (0 V), and the third and fourth drive pulse signals $\phi$V3 and $\phi$V4 are at the low level (−9 V). At the next instant t9, the third drive pulse signal $\phi$V3 has switched to the high level, and therefore, the unwanted charge is accumulated under the first, second and third electrodes G1, G2 and G3. At the next instant t10, the second drive pulse signal $\phi$V2 is at the low level, and therefore, the unwanted charge is divided into a first portion under the first electrode G1 and a second portion under the third electrode G3.

At an instant t11, the second drive pulse signal $\phi$V2 has switched again to the high level, and the unwanted charge is transferred and accumulated again under the first, second and third electrodes G1, G2 and G3. During the readout period T after the instant t10, a readout pulse p (15 V) is applied to each of the first and third transfer electrodes G1 and G3. Therefore, signal charge packets of the sensing elements are transferred to the associated vertical shift register, and accumulated in the respective storage sites under the first, second and third electrodes G1, G2 and G3 at t11. The storage levels of the signal charge are shown by one dot chain lines in FIG. 8.

In the even field, as shown in FIGS. 9 and 10, unwanted charge such as smear charge is shifted during an interval between t0 and T8, from the location under the first and second transfer electrodes G1 and G2 of the first electrode set, for example, to the location under the first and second transfer electrodes G1 and G2 of the second electrode set, as in the odd field. Then, the third drive pulse signal $\phi$V3 is switched to the high level, so that, at an instant t9, the first, second and third drive pulse signals $\phi$V1, $\phi$V2 and $\phi$V3 are high and the fourth drive pulse signal $\phi$V4 is low as shown in FIG. 9. Therefore, the unwanted charge is accumulated at t9 under the first, second and third transfer electrodes G1, G2 and G3 of each set. At an instant t10, because of the most recent fall of the second drive pulse signal $\phi$V2 to the lower level between t9 and t10 in FIG. 9, the unwanted charge is divided into a first portion under the first transfer electrode G1 and a second portion under the third transfer electrode G3 by a potential barrier formed under each second transfer electrode G2.

At an instant t11, the fourth drive pulse signal $\phi$V4 has risen to the high level, and the unwanted charge is accumulated under the third, fourth and first transfer electrodes G3, G4 and G1. During the readout period T between t10 and t11, the readout pulses p are applied to the first and third transfer electrode G1 and G3 as shown in FIG. 9, so that signal charge packets are taken out from the sensing elements and accumulated at the instant t11 under the third, fourth and first electrodes G3, G4 and G1, as shown by one dot chain lines in FIG. 10.

In the conventional CCD imager, however, nonuniform distribution of unwanted non-signal change in the even field causes noise in reproduced picture imagery. As shown in FIG. 10, the unwanted charge residing in each temporary storage site at t9 is divided into two portions at t10 due to a potential barrier formed under each second transfer electrode G2 with the second drive pulse signal $\phi$V2 at the lower level. In this case, the allotment is not uniform but differs in different locations. The ratio between two portions into which an unwanted charge packet is divided is affected by irregularity in pattern and fabricating process. In the example shown in FIG. 10, each unwanted charge packet existing at t9 is split at t10 in two unequal parts, and the ratio of one part to the other is 4:6 in one packet, and 8:2 in the next packet.

Figure 11:
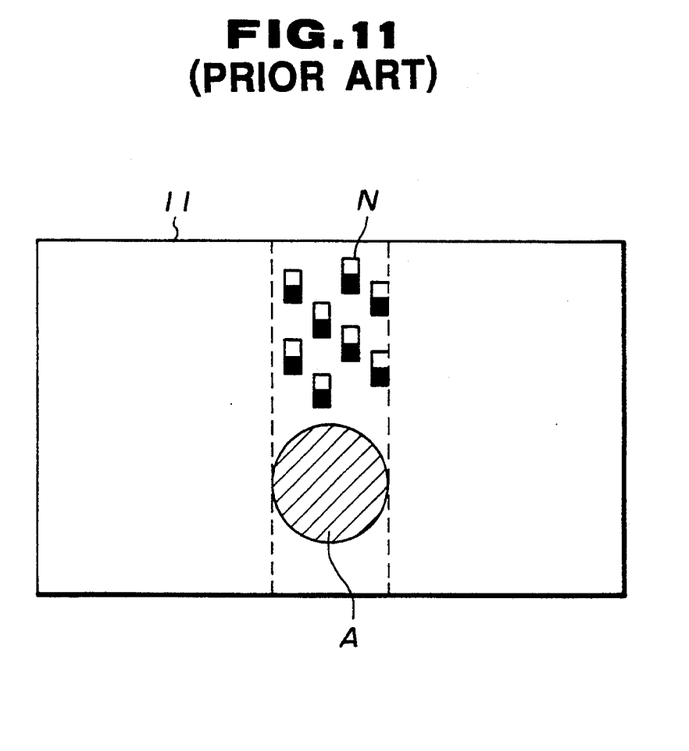
FIG. 11 is a schematic view showing point defects in a picture produced by the conventional imager.

At the instant t11, a potential well is formed under each fourth transfer electrode G4 by the fourth pulse signal switched to the high level while the potential barrier under each second transfer electrode G2 still remains. Therefore, the unwanted charge remains nonuniformly distributed among a plurality of wide potential wells of a threefold width (as schematically shown in FIG. 10) formed, respectively, under a plurality of three consecutive electrode sets of the third, fourth and first transfer electrodes G3, G4 and G1. The signal charge from the sensing elements is accumulated in the threefold wide potential wells among which the unwanted charges are nonuniformly distributed. As a result, the level of accumulated charge differs from bit to bit in the vertical register. In the example shown in FIG. 10, the amount of accumulation is great in one potential well W2 while the neighboring potential wells W1 and W3 on both sides are filled only to lower levels. Because of this irregularity, the quality of pictures is significantly degraded by unseemly noises (black-and-white point defects) N appearing, in a picture 11 as shown in FIG. 11, in positional relation in the vertical direction with an image of a bright object A.

In the odd field, on the other hand, the uneven distribution of the non-signal charge appearing at the instant t10 in FIG. 8 is only a temporary one which disappears shortly and causes no defects in the reproduced picture. At the next instant t11 in FIG. 8, the same potential well is formed as at the instant t9 under each neighboring group of the first, second and third transfer electrodes G1, G2 and G3. Therefore, the distribution of the unwanted charges is restored to the uniform state existing at the instant t9.

SUMMARY OF THE INVENTION

It is therefore an object of the present invention to provide a solid-state imager which can prevent nonuniform distribution of charge and improve the quality of reproduced pictures.

According to the present invention, a solid-state imager comprises at least one four-phase vertical shift register. The four-phase vertical shift register comprises at least one first transfer electrode to which a first drive pulse signal is to be applied, at least one second transfer electrode to which a second drive pulse signal is to be applied, at least one third transfer electrode to which a third drive pulse signal is to be applied, and at least one fourth transfer electrode to which a fourth drive pulse signal is to be applied. Each of the transfer electrodes is formed on an insulating layer which is formed on a top surface of a semiconductor substrate. This vertical shift register is so connected with a photosensitive imaging section that photogenerated signal charge packets are transferred from the imaging section to the vertical shift register by applying a readout voltage to the first and third transfer electrodes. In the solid-state imager according to the present invention, a potential well under the first transfer electrode is deeper than a potential well under any of the second, third and fourth transfer electrodes.

This solid-state imager according to the present invention can accumulate unwanted charge such as smear charge in the deeper potential well under the first transfer electrode, and prevent the unwanted charge from moving from under the first transfer electrode to next storage sites under the second and third transfer electrodes. In this way, this solid-state imager can prevent the unwanted charge from being divided into two unequal parts, by temporarily trapping the unwanted charge under the first transfer electrode.

DETAILED DESCRIPTION OF THE INVENTION

Figure 1A:
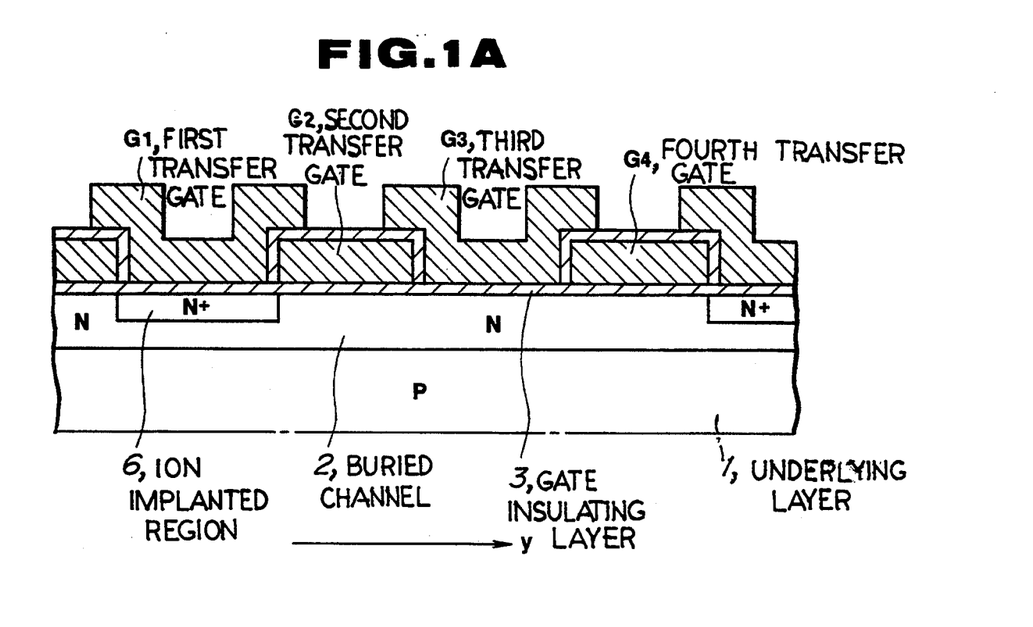
FIG. 1A is a schematic sectional view showing a main portion (a vertical shift register and its transfer stage) of a CCD solid-state imager according to one embodiment of the present invention.
Figure 1B:
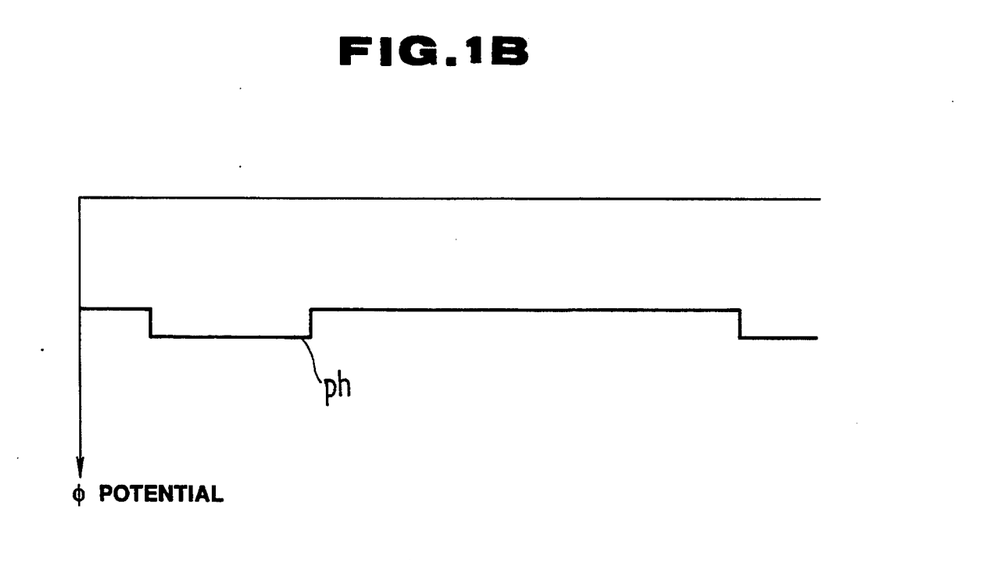
FIG. 1B is a view showing a potential profile in the vertical shift register shown in FIG. 1A with all the transfer electrodes G1, G2, G3 and G4 held at the same potential.
Figure 2A:
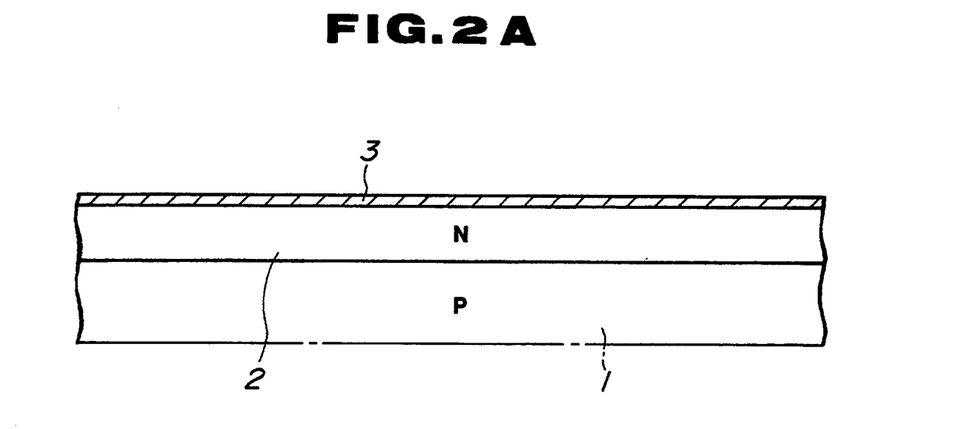
FIGS. 2A and 2B are cross sectional views showing one process for fabricating the structure shown in FIG. 1A.
Figure 2B:
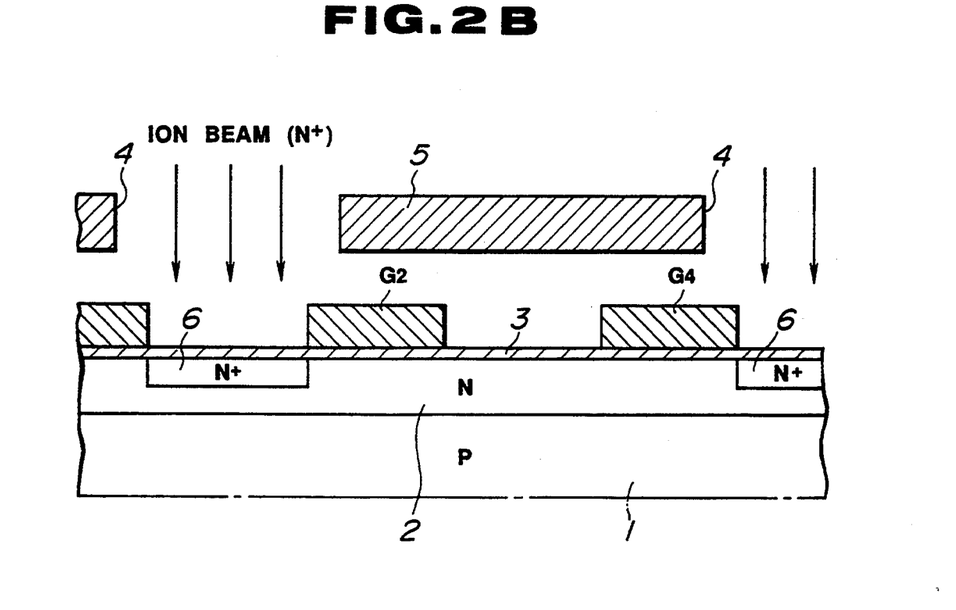
Figure 3:
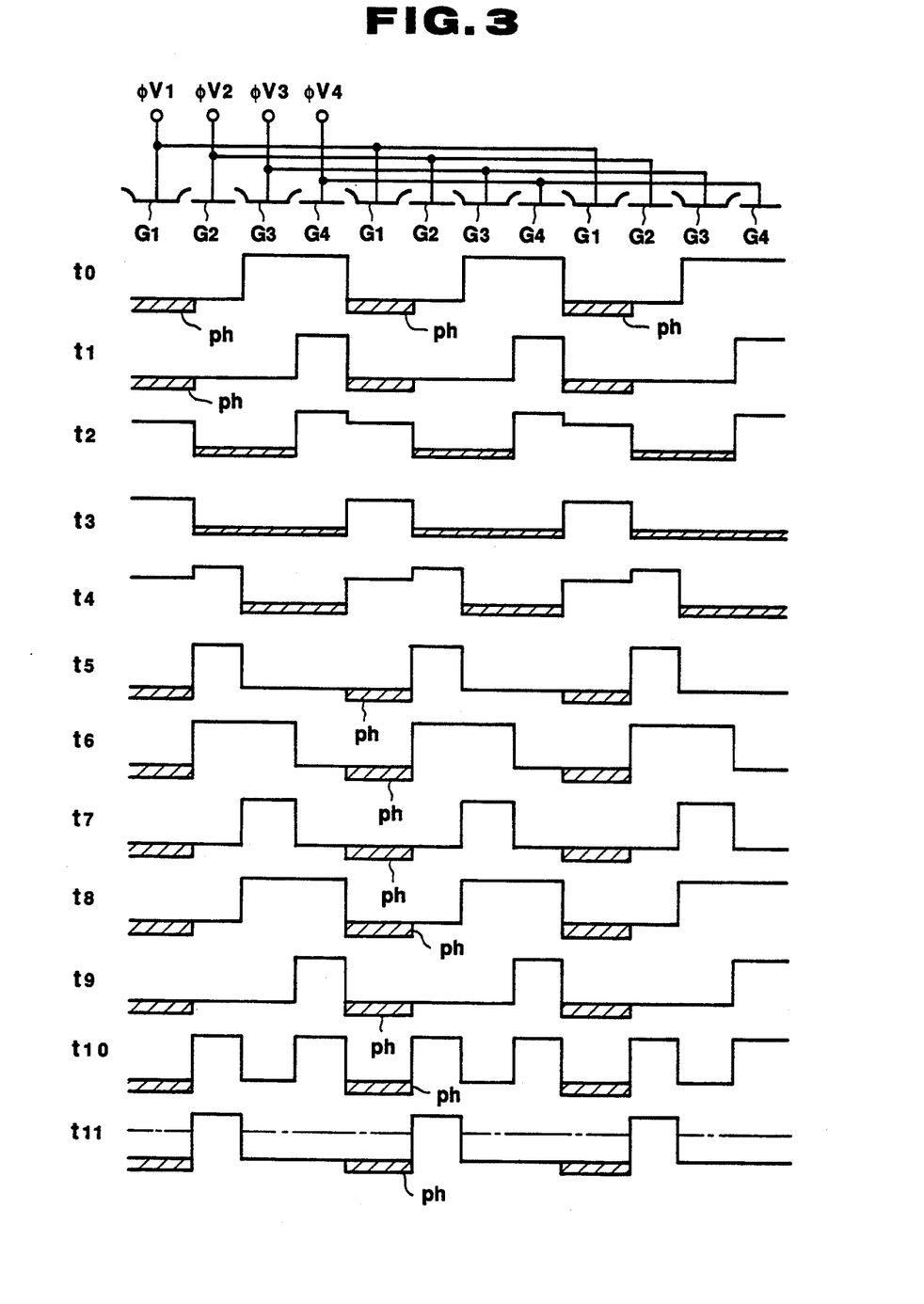
FIG. 3 is a schematic view showing operations of the vertical shift register shown in FIG. 1A in the even field.

FIGS. 1A, 1B, 2A, 2B, 3 and 4A–4C show one embodiment of the present invention. A CCD imager according to this embodiment has vertical shift registers one of which is shown in FIG. 1A. This example employs a P-type substrate 1. In the section of FIG. 1A, an N-type diffusion layer 2 is formed on the P-type underlying layer of the substrate 1. The imager has a plurality of electrodes sets each of which consists of first, second, third and fourth transfer electrodes G1, G2, G3 and G4. Each of the transfer electrodes G1, G2, G3 and G4 is formed on a gate insulating layer 3 which is in turn formed on the top surface of the N-type layer 2. In this example, the second and fourth transfer electrodes G2 and G4 are formed by a first (lower) polycrystalline silicon layer, and the first and third transfer electrodes G1 and G3 are formed by a second (upper) polycrystalline silicon layer. These transfer electrodes G1, G2, G3 and G4 are regularly arrayed (as shown in FIG. 3) in the vertical direction (the y direction in FIG. 1A) to form each of the vertical shift registers with the N-type top layer 2.

The first transfer electrodes G1 are all connected to a first clock input terminal for receiving a first drive pulse signal $\phi V1$ from a driver circuit (or driving means) 21 (shown in FIG. 8). The second transfer electrodes G2 are all connected to a second clock input terminal for receiving a second drive pulse signal $\phi V2$ of the driver circuit 21. There are further provided a third clock input terminal, connected with all the third transfer electrodes G3, for receiving a third drive pulse signal $\phi V3$, and a fourth clock input terminal, connected with all the fourth transfer electrodes G4, for receiving a fourth drive pulse signal $\phi V4$.

In this embodiment, there is further formed, under each first transfer electrode G1, a region 6 for forming a potential step ph shown in FIG. 1B by making the impurity concentration higher under each first electrode G1 than under any of the second, third and fourth electrodes G2, G3 and G4. In this embodiment, the region 6 is a highly doped N+-type region extending into the N-type top layer 2 from the top surface of the N-type layer 2. When the same voltage is applied to all the electrodes G1, G2, G3 and G4, the potential is made higher only under the first electrodes G1, as shown in FIG. 1B, than the potential under the second, third and fourth electrodes G2, G3 and G4.

FIGS. 2A and 2B show one fabricating process for the structure shown in FIG. 1A. As shown in FIG. 2A, the N-type top layer 2 used as the vertical shift register is first formed on the P-type silicon substrate 1. Then, the gate insulating film 3 of $SiO_2$ is formed, on the top surface of the semiconductor substrate, by thermal oxidation.

Thereafter, as shown in FIG. 2B, the second and fourth electrodes G2 and G4 are formed by depositing and patterning the first polysilicon layer. Then, the highly doped N+-type regions 6 are formed in the N-type top layer 2 by a step of ion implantation introducing the N-type impurities such as phosphorus (P) or arsenic (As), using a mask 5 having windows 4 opened at positions at which the first electrodes G1 are to be formed.

Then, as shown in FIG. 1A, the first and third transfer electrodes G1 and G3 are formed by patterning the second polysilicon layer. In this way, the impurity concentration can be made higher only under the first electrodes G1. The impurity concentration is substantially uniform in the N-type top layer 2 along the y direction under the second, third and fourth transfer electrodes G2, G3 and G4.

The CCD imager according to this embodiment of the invention is operated as shown in FIG. 3. The vertical shift register shown in FIG. 1A is clocked in the even field by the four drive pulse signals shown in FIG. 9. In FIG. 9, clock timings in an interval between t0~t8 are determined according to an ordinary four-phase clock timing schedule for line shift (vertical scanning). The period T is a readout period for transferring signal charge from the sensing elements of the photosensitive imaging section to the vertical shift registers.

At an initial instant t0 shown in FIGS. 3 and 9, the first and second drive pulse signals $\phi V1$ and $\phi V2$ are in the high level, and the third and fourth drive pulse signals $\phi V3$ and $\phi V4$ are in the low level. This state is an initial state of the vertical transfer. In this state, a continuous potential well is formed under each neighboring pair of the first and second transfer electrodes G1 and G2 held at the high level. In this state, unwanted non-signal charge such as smear charge and dark signal charge is accumulated in the potential step ph formed under each of the first transfer electrodes G1, as shown in FIG. 3. The unwanted charge is shown by parallel oblique lines in FIG. 3.

At the first point t1 in time, the third drive pulse signal $\phi V3$ is in the high level together with the first and second drive signals $\phi V1$ and $\phi V2$, and therefore the potential well under each neighboring pair of the first and second electrodes G1 and G2 extends under the next third electrode G3. However, the unwanted charge is still held in the potential step ph under each first electrode G1.

At the second point t2 in time, the first drive pulse signal $\phi V1$ is switched to the low level, and lowers the potential under each first electrode G1. Therefore, the unwanted charge is transferred in the vertical shift direction, and stored under the second and third electrodes G2 and G3.

At the instant t3, the fourth drive signal $\phi V4$ is held in the high level together with the second and third signals $\phi V2$ and $\phi V3$, and the unwanted charge is stored in the potential well formed under each neighboring group of the second, third and fourth electrodes G2, G3 and G4.

At the instant t4, the second drive pulse signal $\phi V2$ has been switched to the low level, and a potential barrier is formed under each second transfer electrode G2. Therefore, the unwanted charge is stored under each neighboring pair of the third and fourth electrodes G3 and G4.

At the instant t5, the potential is made higher again under each first electrode G1 by the first drive pulse signal $\phi V1$ switched to the high level, and therefore, the unwanted charge is collected again in the potential step ph beneath each first electrode G1.

At the instant t6, a potential barrier is formed under each third electrode G3 with the third drive pulse signal $\phi V3$ in the low level. Nevertheless, the unwanted charge is still held in the potential step ph under each first electrode G1.

At the instant t7, a potential well is formed under each second electrode G2 by a rise of the second drive pulse signal $\phi V2$ to the high level. The unwanted charge yet remains in the potential step ph under each first electrode G1.

At the instant t8, the fourth drive pulse signal $\phi V4$ is in the low level, and a potential barrier is formed under each fourth electrode G4. The unwanted charge is still in the potential steps ph.

At the instant t9, the third drive pulse signal $\phi V3$ switched to the high level forms potential wells under the third electrodes G3. At the ninth instant t9, there are formed a plurality of threefold wide stepped potential wells each of which is formed under a neighboring group of the first, second and third transfer electrodes G1, G2 and G3. Each of these stepped wells is deeper only under the first electrode G1, and slightly shallower under the second and third transfer electrodes G2 and G3. Therefore, the unwanted charge is still trapped under the first transfer electrode G1.

At the instant t10, potential barriers are formed under the second electrodes G2 with the second drive pulse signal φV2 in the low level. In this case, the unwanted charge in each potential step ph is not divided into two portions, but all of the unwanted charge is persistently confined in each potential step ph. In the case of the conventional device, the formation of a potential barrier appearing under each second electrode at the instant t10 causes uneven distribution of the unwanted charge as shown in FIG. 10. In the vertical shift register according to this embodiment of the invention, by contrast, the potential steps ph prevent nonuniform redistribution of the unwanted charge by holding the unwanted charges under the first electrodes G1.

At the instant t11, although potential wells are formed under the fourth electrodes G4 with the fourth signal φV4 in the high level, the unwanted charge is invariably held in the potential steps ph under the first electrodes G1. During the transferred from the sensing elements to the vertical shift register by the readout pulses applied to the first and third electrodes G1 and G3, and accumulated in the potential wells under neighboring groups of the third, fourth and first electrodes G3, G4 and G1, as shown by one dot chain lines in FIG. 3.

Thereafter, the signal charge packets are transferred sequentially to a horizontal shift register under the control of the four-phase drive pulses φV1~φV4 of proper phases, together with the unwanted charge.

Figure 4A:
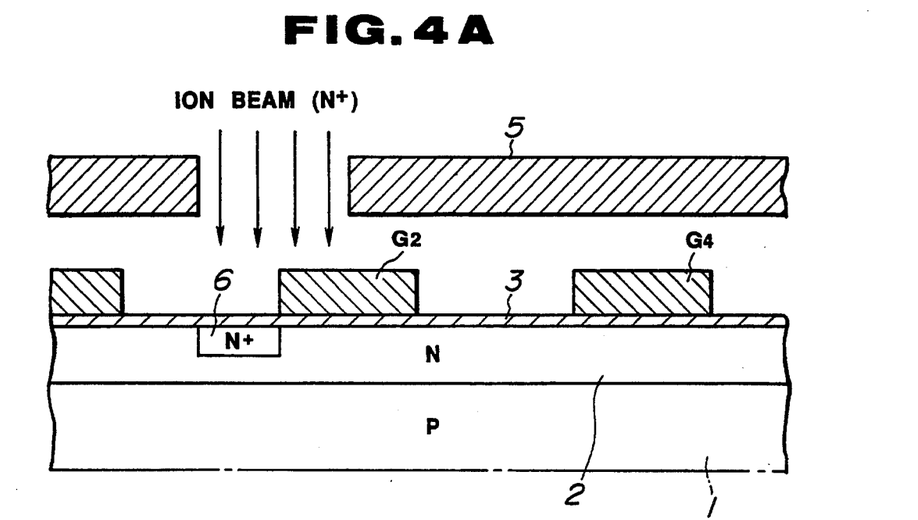
FIGS. 4A and 4B are sectional views showing a process for fabricating a modification of the structure shown in FIG. 1A.
Figure 4B:
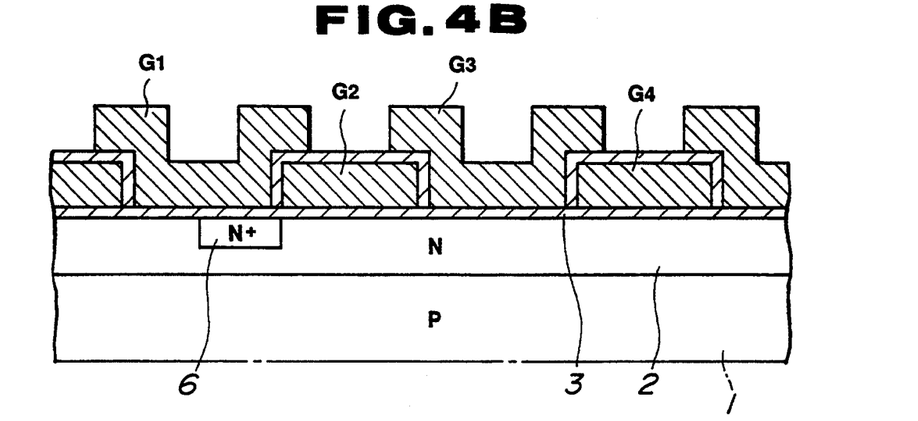

FIG. 4A shows a variation of the embodiment, in which the highly doped N+-type region 6 is formed only partially under each first electrode G1. In the example shown in FIG. 4A, the highly doped N+-type region 6 is formed by ion implantation only under the right half of each first electrode G1. As shown in FIG. 4A, a mask 5 is aligned to protect the silicon surface under the left halves of the first electrodes G1 against the implanted ions. The original doping level of the N-type layer 2 is held unchanged under the left halves of the first electrodes as well as under the second, third and fourth electrodes G2, G3 and G4, as shown in FIG. 4B.

Figure 4C:
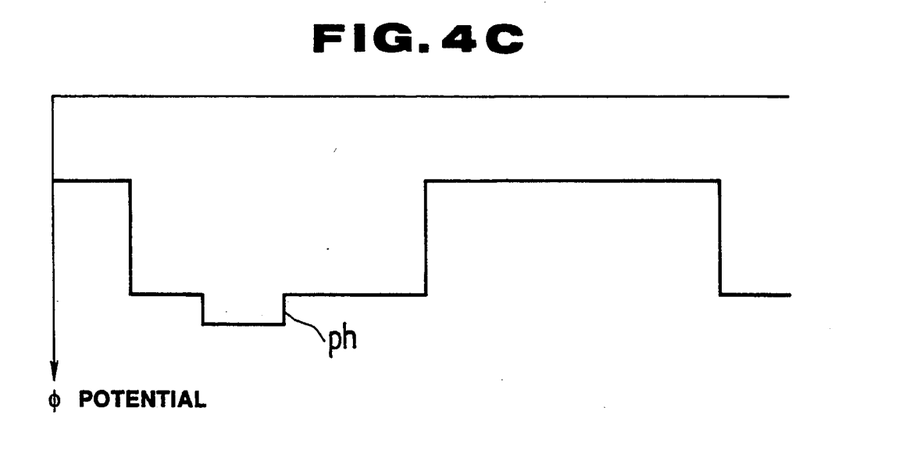
FIG. 4C is a view showing a potential profile in the vertical shift register shown in FIG. 4B with the first and second transfer electrodes G1 and G2 at a high level potential, and the third and fourth transfer electrodes G3 and G4 at a low level potential.

When the high level potential is applied to the first and second electrodes G1 and G2 and the low level potential is applied to the third and fourth electrodes G3 and G4, then a potential step ph is formed only in a portion corresponding to each highly doped region 6, as shown in FIG. 4C. Therefore, this structure can not only accumulate unwanted charge packets but also improve the vertical transfer efficiency of signal charge packets.

In the examples shown in FIGS. 1A and 4A, the highly doped regions 6 are used as a means for creating the potential steps ph under the first transfer electrodes G1. However, it is possible to create potential steps only under the first electrodes G1 by setting the first drive pulse signal φV1 at a slightly higher bias than the bias conditions of the other three drive pulse signals φV2, φV3 and φV4.

In this way, the CCD imagers according to the present invention can prevent nonuniform distribution of smear charge, and prevent defects in reproduced pictures.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

What is claimed is:

1. A solid-state imager comprising:
   a photosensitive imaging section comprising a plurality of photosensitive elements arranged on a surface of a semiconductor substrate;
   first, second, third and fourth input terminals for receiving, respectively, first, second, third and fourth four-phase drive pulse signals; and
   a four-phase vertical shift register arranged along side said photosensitive imaging section and clocked by the four-phase drive pulse signals comprising a first transfer electrode connected with said first input terminal, a second transfer electrode connected with said second input terminal, a third transfer electrode connected with said third input terminal, and a fourth transfer electrode connected with said fourth input terminal, each of said transfer electrodes being formed on an insulating layer which is formed on a top surface of said semiconductor substrate wherein prior to applying a readout voltage, unwanted charges are trapped under the first transfer electrode at a first time and potential barriers are formed under the second transfer electrode at a second time, said vertical shift register being connected with said imaging elements so that signal charge packets are transferred from said imaging elements to said vertical shift register by applying the readout voltage at a third time to each of said first and third transfer electrodes;
   wherein a potential well under said first transfer electrode is deeper than a potential well under any of said second, third and fourth transfer electrodes when same voltages are applied to said first, second, third and fourth transfer electrodes.

2. The solid-state imager according to claim 1, wherein said first and third transfer electrodes are applied one of three different values of voltage including said readout voltage.

3. The solid-state imager according to claim 1, wherein the potential well under said first transfer electrode is made different from those under said second, third and fourth transfer electrodes by implanting impurities of different concentrations.

4. The solid-state imager according to claim 3, wherein said substrate comprises a P-type underlying layer and an N-type buried channel extending on said underlying layer.

5. The solid-state imager according to claim 4, wherein said substrate further comprises an N-type ion implanted region which is formed under said first transfer electrode in said N-type buried channel.

6. The solid-state imager according to claim 5, wherein said N-type ion implanted region is formed by ion implantation with an N-type dopant of phosphorus.

7. The solid-state imager according to claim 5, wherein said N-type ion implanted region is formed by ion implantation with an N-type dopant of arsenic.

* * * * *